United States Patent
Linder et al.

(10) Patent No.: US 11,404,592 B2
(45) Date of Patent: Aug. 2, 2022

(54) ROOM TEMPERATURE PRINTING METHOD FOR PRODUCING A PV LAYER SEQUENCE AND PV LAYER SEQUENCE OBTAINED USING THE METHOD

(71) Applicant: DYNAMIC SOLAR SYSTEMS AG, Frankfurt am Main (DE)

(72) Inventors: Daniel Linder, Lehrberg (DE); Patrick Linder, Lehrberg (DE)

(73) Assignee: DYNAMIC SOLAR SYSTEMS AG, Frankfurt am Main (DE)

( * ) Notice: Subject to any disclaimer, the term of this patent is extended or adjusted under 35 U.S.C. 154(b) by 249 days.

(21) Appl. No.: 16/317,223

(22) PCT Filed: Jul. 11, 2017

(86) PCT No.: PCT/DE2017/100572
§ 371 (c)(1),
(2) Date: May 22, 2019

(87) PCT Pub. No.: WO2018/010727
PCT Pub. Date: Jan. 18, 2018

(65) Prior Publication Data
US 2019/0280135 A1    Sep. 12, 2019

(30) Foreign Application Priority Data

Jul. 12, 2016 (DE) ..................... 10 2016 008 383.2

(51) Int. Cl.
*H01L 31/0384* (2006.01)
*H01L 31/0312* (2006.01)
(Continued)

(52) U.S. Cl.
CPC .... *H01L 31/03845* (2013.01); *H01L 21/0259* (2013.01); *H01L 21/02601* (2013.01);
(Continued)

(58) Field of Classification Search
None
See application file for complete search history.

(56) References Cited

U.S. PATENT DOCUMENTS

2010/0167441 A1   7/2010  Ray et al.
2013/0153027 A1*  6/2013  Youngbull ............ H01L 31/055
                                                 136/257

FOREIGN PATENT DOCUMENTS

JP    H11317534 A    11/1999
JP    2012507872 A    3/2012

* cited by examiner

*Primary Examiner* — Nilufa Rahim
(74) *Attorney, Agent, or Firm* — Mark M. Friedman

(57) ABSTRACT

PV layer sequences and corresponding production methods which can reliably provide a PV function with a long service life despite very low production costs. This is achieved by a reactive conditioning process of inorganic particles as part of a room-temperature printing method; the reactive surface conditioning process adjusts the PV activity in a precise manner, provides a kinetically controlled reaction product, and can ensure the desired PV activity even when using technically pure starting materials with 97% purity. In concrete embodiments, particles are printed in composite so as to form sub-sections on a support. Each sub-section has a reductively treated section and an oxidatively treated section, and the sections have PV activity with opposite signs. The sections can be cascaded in rows via upper-face contacts, and a precise light-dependent potential sum can be tapped via a PV measuring group.

14 Claims, 13 Drawing Sheets

(51) Int. Cl.
*H01L 31/18* (2006.01)
*H01L 31/0224* (2006.01)
*H01L 31/0352* (2006.01)
*H01L 31/05* (2014.01)
*H01L 21/02* (2006.01)

(52) U.S. Cl.
CPC .......... *H01L 21/02628* (2013.01); *H01L 31/022425* (2013.01); *H01L 31/0312* (2013.01); *H01L 31/03125* (2013.01); *H01L 31/035281* (2013.01); *H01L 31/0508* (2013.01); *H01L 31/1812* (2013.01); *H01L 21/02521* (2013.01); *Y02E 10/50* (2013.01)

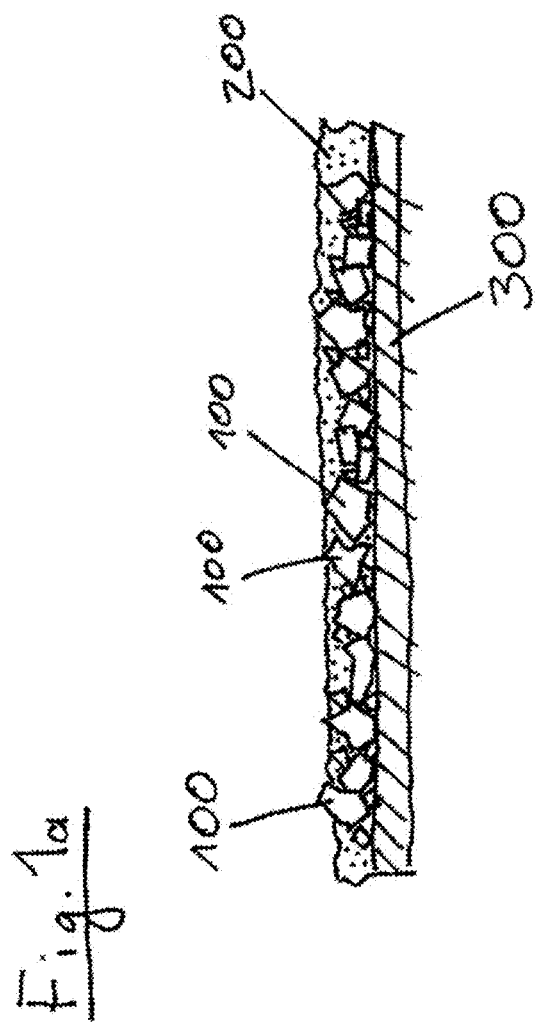

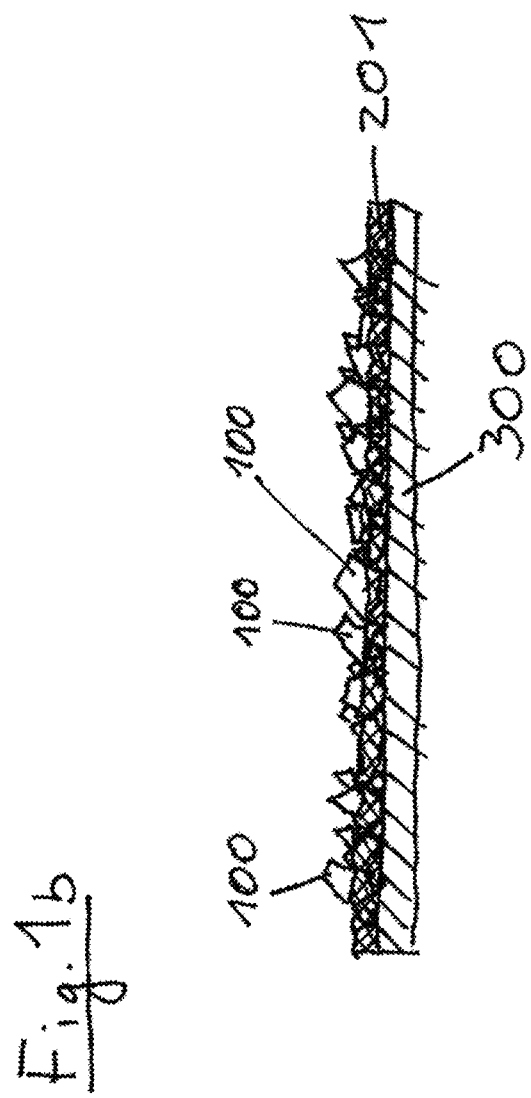

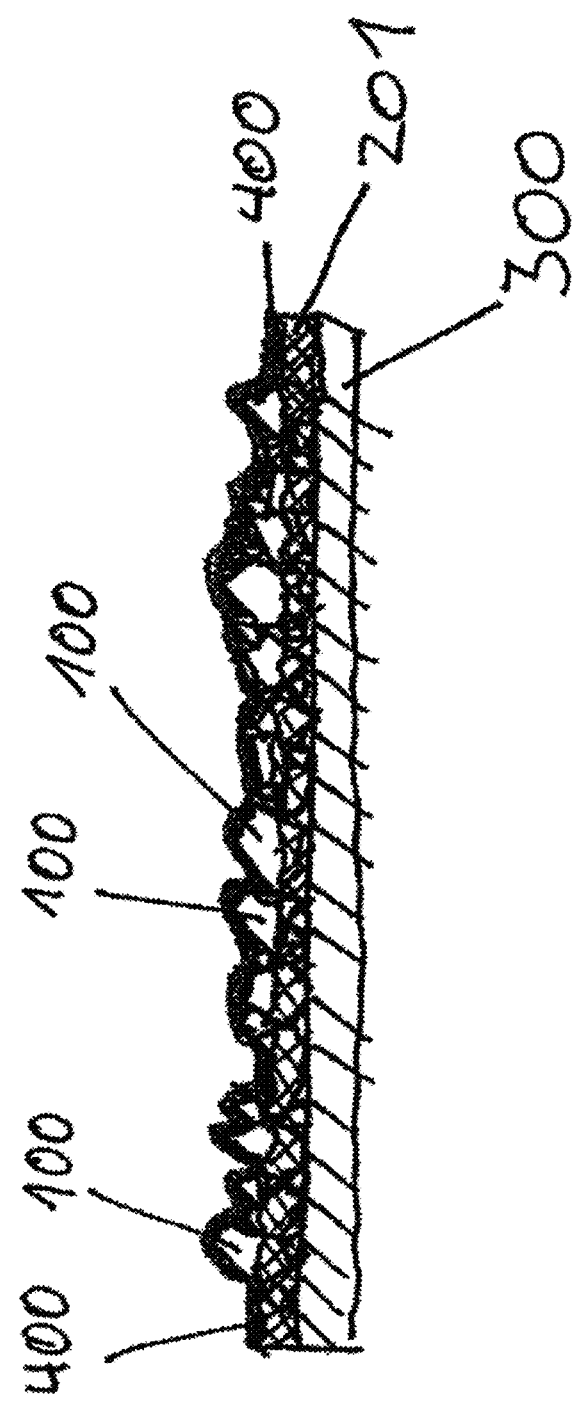

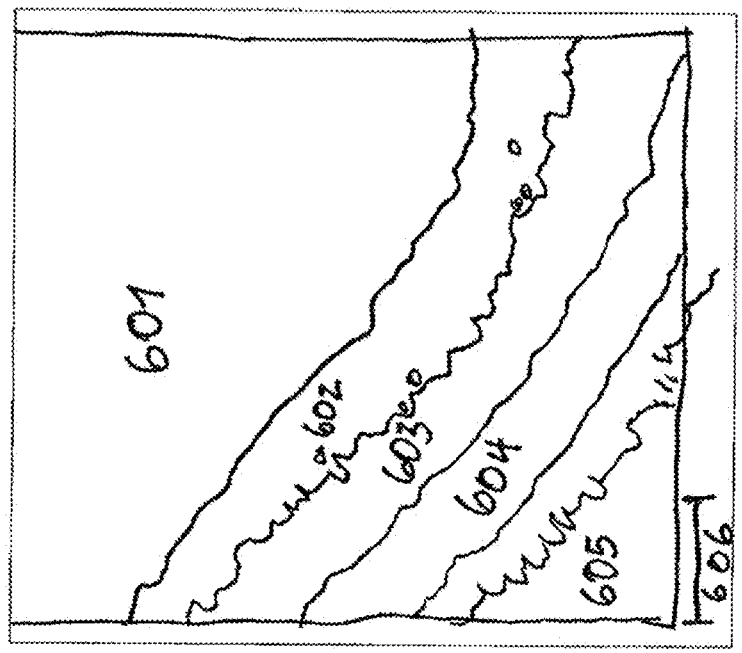
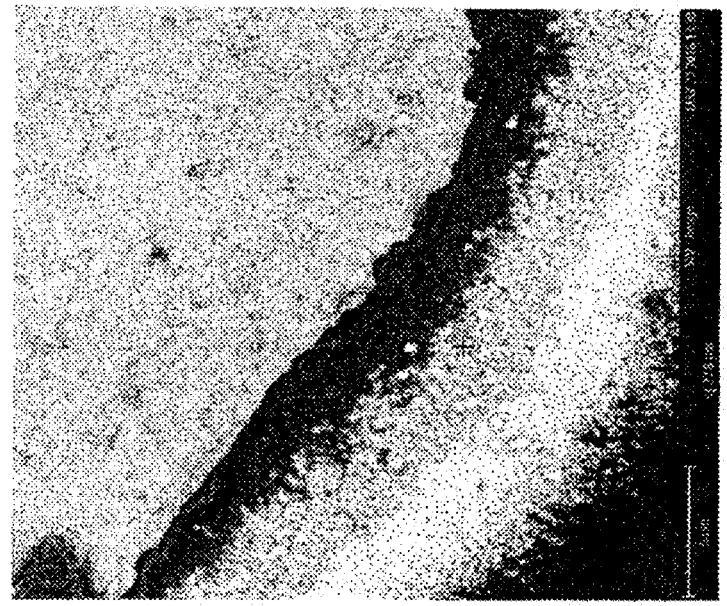
Fig. 9 State of the art

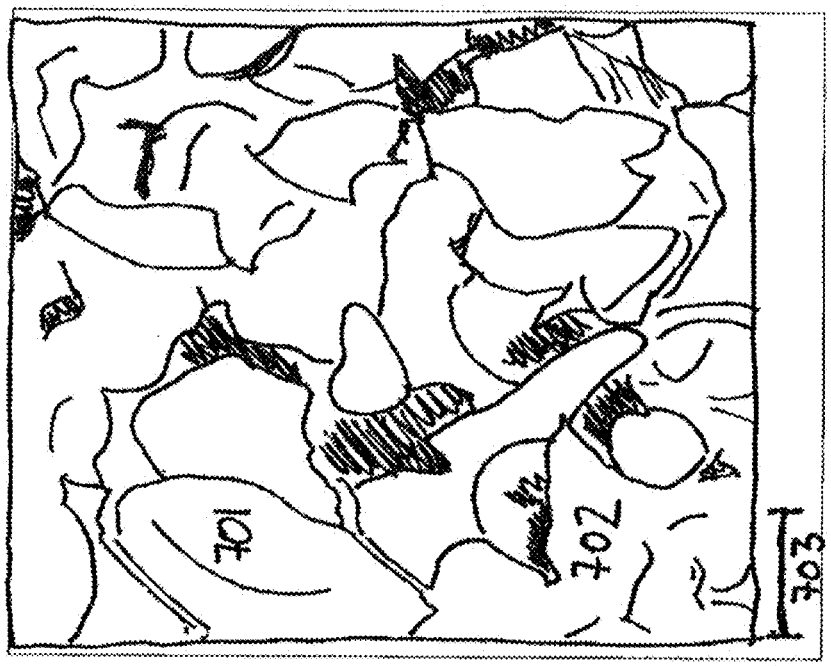
Fig. 10

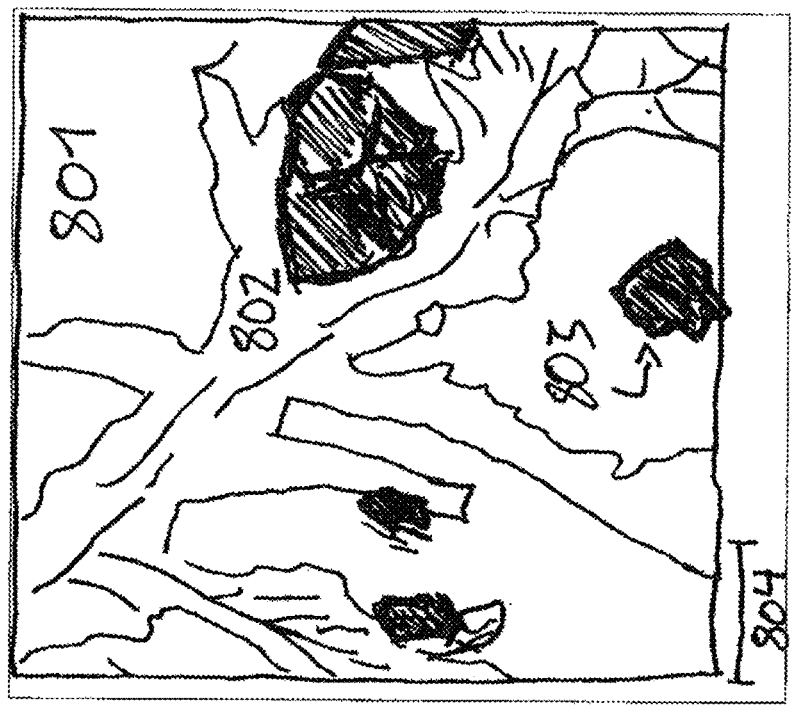
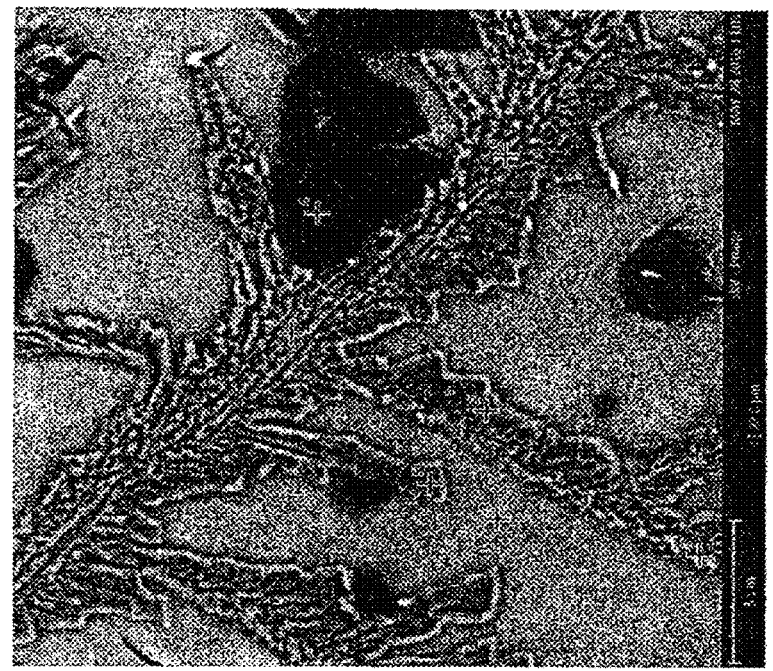
Fig. 11

ROOM TEMPERATURE PRINTING METHOD FOR PRODUCING A PV LAYER SEQUENCE AND PV LAYER SEQUENCE OBTAINED USING THE METHOD

CROSS-REFERENCE TO RELATED APPLICATION

This application is the U.S. national phase of PCT Application No. PCT/DE2017/100572 filed on Jul. 11, 2017, which claims priority to DE Patent Application No. 10 2016 008 383.2 filed on Jul. 12, 2016, the disclosures of which are incorporated in their entirety by reference herein.

TECHNICAL BACKGROUND

The technical field can generally be described by the term 'electrical thin layers'. Thin layers of this kind have a thickness of fractions of micrometers to several hundred micrometers and find use in the production, processing, control, regulation, measurement and conduction of power.

Specifically, the present invention is based on photovoltaic, electrical systems in which current is produced from photons. 'Photovoltaic' here—and also hereinafter—is abbreviated simply to 'PV'. The applicant has long been an employee of multiple associated companies in the PV sector. By way of illustration, reference is made to WO 2014-019560 A1, which, together with the documents cited and searched for in this family of property rights, can be regarded as basic technical background for printed systems in the technical PV sector of relevance here.

Proceeding from the known and established systems, the applicant has researched and developed processes and products so that these can generate, process, store and utilize PV energy in a robust and long-term manner with minimum production costs. By way of illustration, reference is made to the families of property rights of DE 10 2015 102 801.8, DE 10 2015 01 54 35.4, DE 10 2015 56 00.4 and DE 10 2016 002 213.2 A, the technical teaching of which was the foundation of the present invention and gives a meaningful outline of the relevant knowledge and ability. By way of preparation, the teaching and core components of the aforementioned property rights in light of the prior art are outlined briefly hereinafter.

DESCRIPTION OF THE PRIOR ART

The present invention relates to a room temperature process for producing a PV layer sequence and to the PV layer sequence from the process according to the preamble of the independent claims.

An essential component of the present invention has been found to be the manufacture of inorganic core components at room temperature with aqueous dispersions and solutions:

Inorganic core components have a considerably longer service life than corresponding organic systems. Organic PV layer sequences last for a few days to months, whereas inorganic, PV-active components in standardized climate-controlled chamber tests with a simulated lifetime of up to 30 years always showed at least 90% of the initial performance; the corresponding tests were failed by organic modifiers, auxiliaries and additives, for example polymeric embedding material for the glass-glass carrier or the organic fiber composite carrier of the PV-active thin-layer combination, but the power-generating core component with its metallic feed wires, in spite of an extremely weathered and unsightly overall product, continued to fulfill the desired function and generated power. This is attributed by the inventors to the inorganic nature of the core components of the PV layer sequence that naturally do not include any polymers or organic hydrocarbon compounds.

Room temperature processes were enabled by reactive systems that introduce chemical reaction energy for formation and establishment of the layers. 'Room temperature' encompasses customary temperature ranges for industrial manufacture, which, according to the location of a factory, can be between a few degrees Celsius above zero up to 80 degrees Celsius. It was found here that the reactions that proceed at room temperature, by comparison with processes with a known compaction and/or sintering step, provide much broader and in some cases extremely different band-gap structures. Thus, it was possible for the first time to produce a layer structure capable of specifically converting contact heat radiation from warm water to power with a narrow wavelength range window.

Aqueous dispersions and solutions are not established on the PV market. The customary silicon wafers, which are difficult to produce, are not compatible with moisture. Particularly suppliers of conductive pastes and conductive applicable electrode materials are frequently confronted with the demand to provide completely anhydrous systems which can be ultimately compacted and sintered in vacuum systems at at least 150° C. in parallel with coating or vapor deposition steps. This is believed by the inventors to be the reason why known printing systems and printing solutions based on aqueous pastes are not employed here. In combination with the measure of 'room temperature', such old methods, however, contrary to expectation, can find use: PV-active semiconductors, metal-nonmetal compounds and metal-metal chalcogenide and also metal-metal halide compounds are found to be sufficiently stable at temperatures of less than 100 degrees Celsius, even when they have been processed and printed in aqueous dispersions or solutions.

Known printing systems and printing solutions here include measures, features and modifiers and auxiliaries as cited in the aforementioned applications and also disclosed, for example, in the printing-related documents DE 122 1651 A, DE 2012 651 B, DE 2529 043 B2, DE 10004997 A, DE 1 907 582 B, DE 2 017 326 A, DE 23 45 493 C2, GB 1 449 821 A, DE 27 33 853 A, DE 34 47 713 A, JP H043 688 87 A, JP H06 001 852 A and DE 43 22 999 A1. Particularly DE 197 20 004 C1 deserves a mention here, since this document discloses the sequential use of mutually matched reactive color inks in inkjet printing methods, which can be considered in parallel with the presently developed reactive printing measures for electrical engineering purposes, and gives a technical demonstration of the implementability of reactive printing systems by means of known printing measures.

However, the inventors are not aware of any printing method of the type according to the preamble from competitors that relies consistently on the production of a complete inorganic PV layer sequence including electrical input and output wires that actually complete contact connection at room temperature.

Disadvantageously, the prior art always envisages, as a constituent of the PV layer sequence, pastes or materials which either contain harmful organic solvents and/or include toxic heavy metals, for example lead, cadmium or selenium, and/or have to be sintered/compacted at temperatures of around 100° C. or more before a PV-active layer sequence including current-receiving conductors and complete contact connection exists. No document discloses a complete and conclusive teaching by which a complete PV layer sequence including electrodes could be obtained in applicable form at room temperature. A further disadvantage is that the established PV layer sequences always have to resort to costly, very pure starting materials in order to be able to reliably provide PV activity.

More particularly, the conventional layer structure of a PV layer sequence in which a bottom-side first electrode has to be contact-connected with a PV-active layer on a first side and the second side as the opposing side by a top-side counterelectrode is found to be disadvantageous: pores, pinholes and gaps in the PV-active layer make top-side contact connection with liquid or pasty systems virtually impossible since they can cause the two electrode layers to form short circuits with one another via the gaps and defects, which means that the PV activity is no longer viably convertible to power in large two-dimensional regions: the PV current flows through the short circuit/gap directly to the opposing side of the PV-active layer and is no longer utilizable; the layer heats up as a result of the PV current and the electrical wear causes the area affected to age considerably and weather prematurely.

It was therefore an object of the present invention to overcome the disadvantages of the prior art and to provide a process and a PV layer sequence by the process, which, in spite of industrial processing at room temperature, inorganic core components and use of aqueous solutions and/or aqueous dispersions, provide a complete PV layer sequence as part of a finished, contact-connectable layer composite.

This object is achieved by the features of the independent claims. Advantageous embodiments will be apparent from the dependent claims and the description which follows.

SUMMARY OF THE INVENTION

The invention provides a process for producing a PV layer sequence, in which
—at room temperature, —inorganic core components are processed using aqueous solutions and/or aqueous dispersions by printing methods to obtain a complete PV layer sequence to which contacts can be formed via electrodes, characterized in that the process comprises the following steps: in a step a) semiconductive particles 100 of size 0.5 to 100 micrometers, consisting of at least two elements, are dispersed in an aqueous reaction solution 200, partly dissolved by oxidation or reduction and applied over the area of a carrier 300, in a step b) the reaction solution 200 is converted with a contraction in volume to a cured reaction solution layer 201, where the particles 100 project beyond the cured reaction solution layer 201 and have a bottom side anchored in the reaction solution layer 201 and a top side that projects beyond the reaction solution layer 201, and in a step c) the top side of the particles is provided at least in sections with a topside contact 400. A PV layer sequence of the invention is obtained by the above-described process and is characterized by particles 100 that are printed onto a carrier in area sections and their PV characteristics are adjusted by the accompanying chemical reaction.

DESCRIPTION OF THE INVENTION AND ADVANTAGEOUS FEATURES

The process of the invention for production of a PV layer sequence builds upon what has already been developed and at first envisages processing of inorganic PV-active core components at room temperature using aqueous solutions and/or aqueous dispersions by printing methods to give a complete PV layer sequence contact-connectable via acceptor electrodes.

What is essential is that the process comprises the following steps: in a step a) semiconductive particles 100 of size 0.5 to 100 micrometers, consisting of at least two elements, are dispersed in an aqueous reaction solution 200, partly dissolved by oxidation or reduction and applied over the area of a carrier 300. The PV-active material consisting of at least two elements is activated by the partial dissolution and its stoichiometry is altered. As a result, a previously uniform and uniform doping or composition undergoes considerable modification in a thin outer layer. This modification is kinetically controlled at room temperature and the most rapidly accessible phases and compounds are formed, which results in products that are at least metastable in nature and differ considerably from the thermodynamically stable products.

In a step b), the reaction solution 200 is converted with a contraction in volume to a cured reaction solution layer 201. The layer had previously been made up and printed as a dispersion, in which the gap volume between the particles was filled essentially by the aqueous reactive solution. The result of the contraction in volume is thus that the solution at first sinks to a degree and exposes some of the particles 100. The reformed metastable phases are fixed and the particles 100 are anchored firmly on the carrier 300. The particles 100 ultimately project beyond the cured reaction solution layer 201. The end result is thus that the particles have a bottom side anchored in the reaction solution layer 201 and a top side that projects beyond the reaction solution layer 201. The accompanying reaction here comes gradually to a stop; the longer the contact with the reaction solution 200, the further the dissolution reaction during the curing has advanced. The inventors assume that this reactive conditioning at least on the top side produces a gradient in the particles that reflects the contact time during the curing, which promotes the PV activity and improves accessibility.

In a step c), the top side of the particles 100 is provided at least in sections with a topside contact 400. PV layer sequences obtained in this way, with SiC particles in the specific working example, show available potential differences of several hundred millivolts. The inventors assume that this can be explained by additional energy levels within the bandgap, which can be attributed to the substoichiometric compounds and defects from the outer surface of the particles 100 that are produced during the reaction. Therefore, it is possible to use PV-active material combinations that are known in principle, which are initially introduced as homogeneous particles and printed on reactively and according to the method claimed, altering their stoichiometry, to produce a PV-active layer sequence in a particularly simple and inexpensive manner. Examples of established and possible PV-active material combinations can be found by way of illustration in DE 39 36 666 C2; in the same way, known metal-metal oxide and metal-metal halide combinations may find use as described above.

Preferably, the process is characterized in that the particles 100 are oxidative or reductively conditioned in at least one surface section in at least one additional step, which defines areas of reductively treated particles 102 or areas of oxidatively treated particles 103. In the specific working example, in SiC particles, it was possible to reverse the sign of the tangible photovoltaic current by oxidative/basic or reductive/acidic conditioning. It was not possible here to measure any dark current that would induce purely electrochemical processes that proceed in the dark and without light as well. The inventors assume that at least two levels within the bandgap have been flooded or emptied here by oxidative or reductive measures, such that the nature of the majority charge carriers between the two energy levels is adjusted to acceptor conduction or to donor conduction according to the conditioning.

Preferably, the process is characterized in that, in a further process step, nanoscale structures comprising at least one structure selected from the group consisting of chains, meshes, mesh tubes are formed in direct contact with particles 100 of at least one area section, preferably an area section on the top side. By electrical coupling to atom chains or molecule chains of different length, it is possible to additionally modify an energy level. In a specific experiment, additions based on carbon black, carbon nanotubes and chain-forming halogens and metal halides in the reaction solution 200 resulted in broader and improved wavelength ranges in which PV activity of the PV layer sequence was detectable. This can be sensibly explained by electrical contacting and modification of the outside of the particles with the nanotubes and -chains.

Preferably, the process is characterized in that mutually adjoining area sections of the particles 100 are conditioned with different solutions, in turn forming the mutually adjoining area sections of the particles 100 in alternating sequence as sections of reductively treated particles 102 and sections of oxidatively treated particles 103. More preferably, the areas are each formed as a combination and arranged with a small distance from one another, by means of which a top-side contact 400 can provide for series connection of the partial areas in a particularly simple manner. In this way, it is possible to combine partial areas with one another to form a cascade in which the potential of the PV activity is additive. In the practical experiment, in an arrangement on a carrier 300 made of wood, this resulted in a tangible voltage of the printed-on particulate PV layer of 1 to 2 volts cascaded solely on the top side.

Preferably, the process is characterized in that, in at least one further process step, electrodes comprising at least one carrier electrode 301 and/or top-side contact layer 400 are applied in a preparatory manner to a two-dimensional material and finally bonded to the PV layer sequence through the two-dimensional material. For this purpose, particular preference is given to printing air-drying and/or reactively curing electrode solution onto a transparent film, followed by an adhesive bonding of the film in two dimensions at a particular position to the printed PV-active layer.

Preferably, the process is characterized in that the carrier used for the PV layer sequence comprises continuous, flat sheets of material, preferably sheets of film and/or sheets of paper, more preferably sheets of hemp paper. Hemp offers the advantage that it can be manufactured in a sulfate-free manner; provided with additional moisture inhibitor and/or biocide, such a hemp paper can advantageously withstand high temperatures without yellowing or significant mechanical degradation or any decline in its properties.

Preferably, the process is characterized in that comminuted, preferably mechanically comminuted, particles 100 having a grain size of not more than 50 micrometers, preferably having a grain size of 30±15 micrometers, more preferably having a grain size of 0.5 to 10 micrometers, are used. Mechanically comminuted particles have corners and edges which can be indented into a carrier and anchored thereon in an improved manner in the printing process.

Preferably, the process is characterized in that the contact electrodes are printed onto and/or arranged on an inside of an embedding film and the PV layer sequence obtained by the process laminated into the embedding film to produce an electrical contact guided out of the embedding material. This particularly efficiently permits the simultaneous formation and contact connection of whole modules as also described for electrode wires in DE 40 18 013 A.

Further advantages and advantageous measures will be apparent from the working examples and the description which follows. The working examples should not be considered to be restrictive. The additional features and additional measures described, and also additional advantageous measures and additional measures as known from the prior art, can advantageously be used in the subject matter claimed within the scope of the independent claims without leaving the scope of the invention.

BRIEF DESCRIPTION OF THE FIGURES

The figures illustrate the following in schematic diagrams:

FIG. 1a the result of step a) of the process, in which a layer comprising particles 100 in reaction solution 200 has been applied to a carrier 300;

FIG. 1b the result of step b) of the process, in which the reaction solution 200 has been cured to a thinner layer, namely the cured reaction solution 201, in which the particles 100 have now been anchored on their underside by the cured layer on the carrier 300 and project from the cured reaction solution 201 on their top side;

FIG. 1C a layer according to FIGS. 1a) and 1b) after conclusive application of a topside contact 400;

FIG. 9 SEM image and analogously drawn schematic diagram with reference numerals for a PV layer sequence according to the prior art, having the surface of a Cu—Ni backside electrode 601, which is adjoined, in section view, after the backside electrode 602, by a TCO layer 603, followed by a PV-active layer 604 based on Si and with a TCO outer layer and AR outer layer, and finally followed by the topside glass carrier 605 with topside; according to scale 606 with 5 micrometers, the entire layer composite is a few micrometers thick;

FIG. 10 SEM image and analogously drawn schematic diagram with reference numerals for a PV layer sequence obtained by the process, having mechanically comminuted particles 701 that have been conditioned and fixed with reaction solution, coated and fixed by cured, vitreously amorphous reaction solution 702, where the scale 703 with 20 micrometers illustrates the distinctly different size ratios of the morphology;

FIG. 11 SEM image and analogously drawn schematic diagram with reference numerals for a PV layer sequence obtained by the process, having phases 801 and 802 in interpenetrating form and surrounding the particles 803 in an anchoring manner, where the scale 804 with 5 micrometers illustrates the distinctly different size ratios of the morphology.

DETAILED ELUCIDATION OF THE INVENTION USING WORKING EXAMPLES

Figure 2:
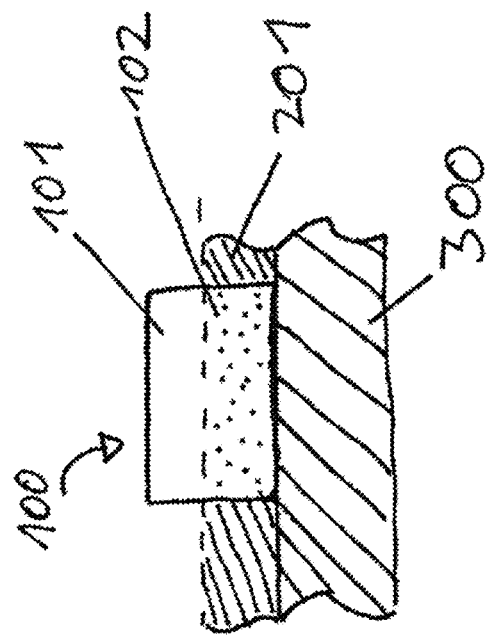
FIG. 2 a particle 100 with top side 101 and reductively treated bottom side 102 in anchoring by the process with cured reaction solution 201 on a carrier 300.
Figure 3:
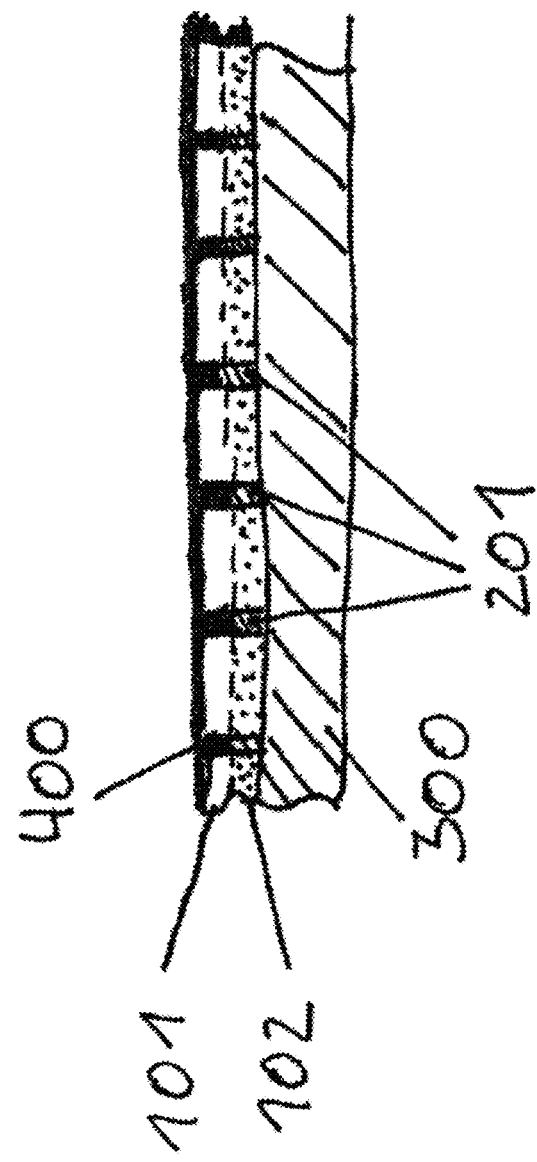
FIG. 3 an arrangement and contact connection of printed partial areas of particles 100 according to FIG. 2 in a simple PV layer sequence with bottom-side counterelectrode (not shown)
Figure 4:
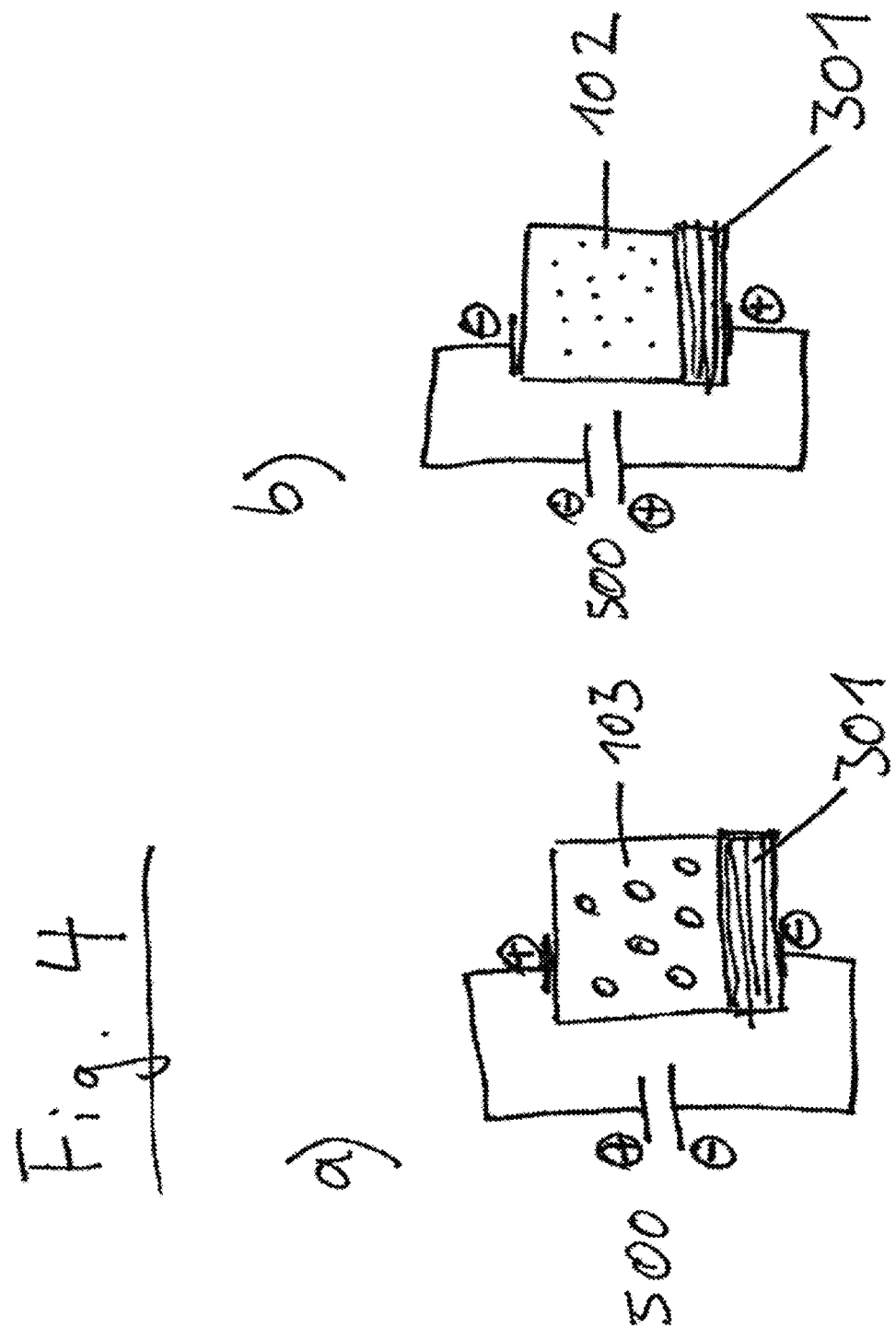
FIG. 4 possible connection and resulting sign of printed partial areas of a PV layer sequence having a) oxidatively treated sections 103 and b) reductively treated sections 102, each with connection of the section to a PV measurement assembly 500, illustrated here as a capacitor, by a bottom-side carrier electrode 301 and a receiver contact mounted on the top side.
Figure 5:
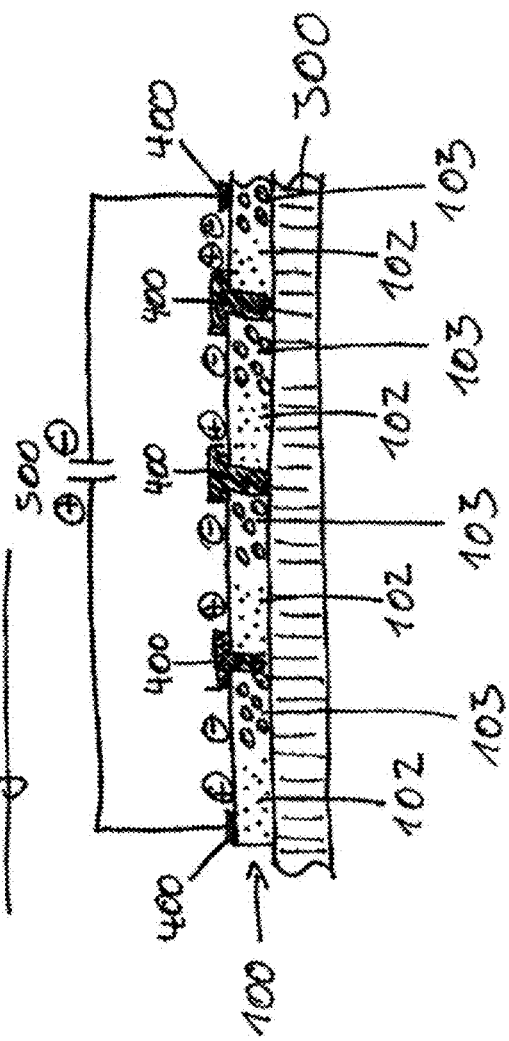
FIG. 5 possible connection of a sequence of subsections printed onto a carrier 300 and comprising particles 100, wherein an oxidatively treated section 102 is combined with a reductively treated section 103 in each subsection and all subsections are cascaded in series via top-side contact 400 and the cascade is connected to a PV measurement assembly 500.
Figure 6:
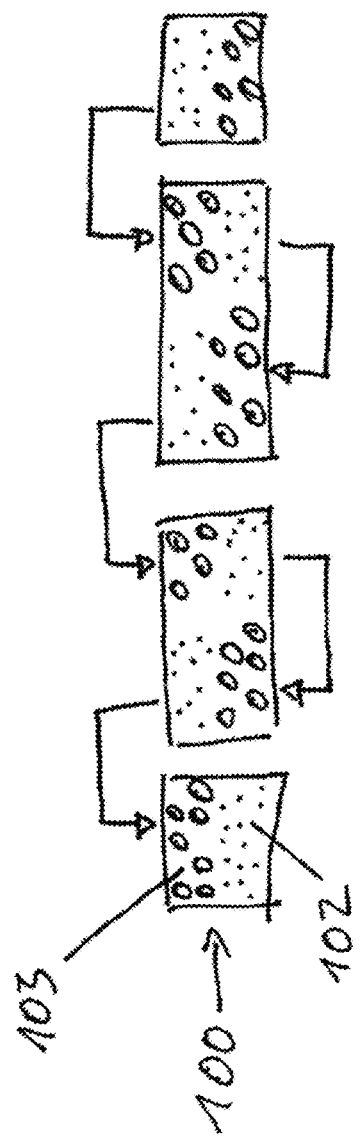
FIG. 6 possible current flow in printed-on subsections comprising particles 100, with cascaded arrangement of reductively treated sections 102 and oxidatively treated sections 103 both in the sections and with one another by contact connection.
Figure 7:
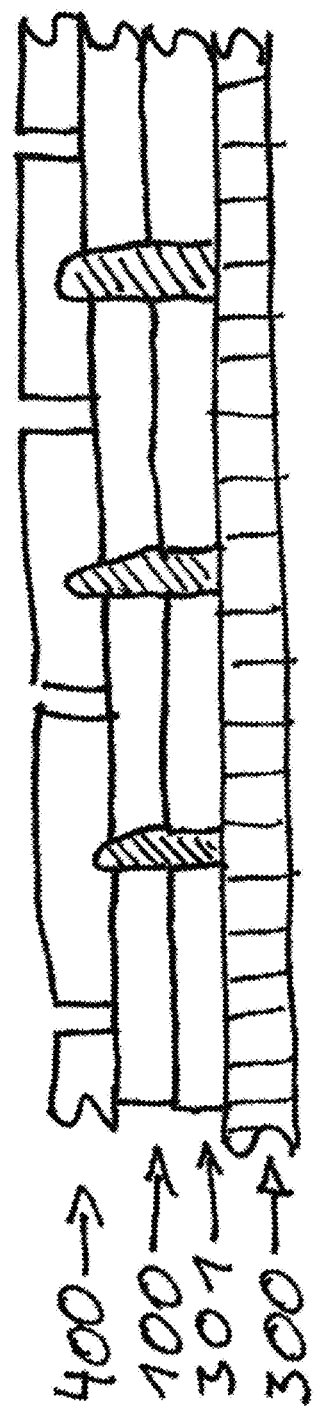
FIG. 7 arrangement of a layer sequence comprising a carrier 300, a bottom-side carrier electrode 301, sections comprising particles 100 and top-side contacts 400.
Figure 8:
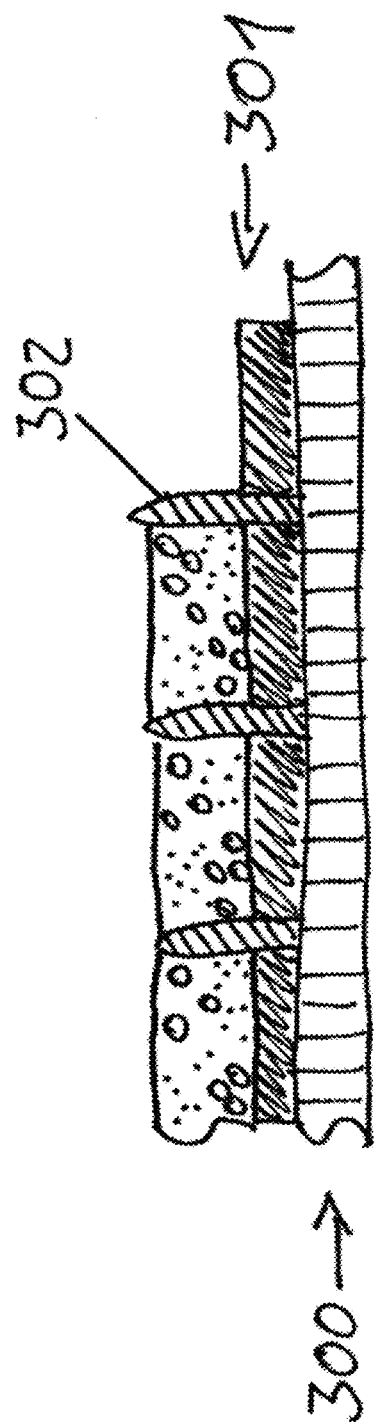
FIG. 8 arrangement according to FIG. 7 in detail with the emphasized elements of carrier 300, carrier electrode 301 and non-conductive border 302 produced by relief printing.

In an advantageous embodiment, a process was conducted, in which, in a step a), semiconductive SiC particles 100 of technical-grade purity and of maximum size 30±15 micrometers are dispersed in an aqueous reaction solution 200 consisting of sodium hydroxide-alkalized silica solution with gentle evolution of gas, partly dissolved by oxidation and applied over the area of sections of a film carrier and/or paper carrier 300 with a carrier electrode 301 applied beforehand, and preferably with an additional printed-on border 302,

- in a step b) the reaction solution 200 is converted with a contraction in volume to a cured reaction solution layer 201, where the particles 100 project beyond the cured reaction solution layer 201 and have a bottom side anchored in the reaction solution layer 201 and a top side that projects beyond the reaction solution layer 201,
- top-side area sections are oxidatively or reductively conditioned, which defines areas of reductively treated particles 102 or areas of oxidatively treated particles 103, in turn forming
    - nanoscale structures comprising at least one structure selected from the group consisting of chains, meshes, mesh tubes, preferably CNT chains and/or halogen chains, in direct contact with particles 100 in at least one area section, and
    - mutually adjoining area sections of the particles 100 are conditioned with different solutions, forming the mutually adjoining area sections of the particles 100 in alternating sequence as sections of reductively treated particles 102 and sections of oxidatively treated particles 103,
- in a step c) the top side of the particles is provided at least in sections with a topside contact 400 and the alternatingly conditioned area sections of the particles 100 are connected in series and bonded to final contact electrodes.

As a halide chain-forming addition, Lugol's solution was added to the reaction solution 200 with a proportion of a few percent by weight.

As elasticity modifier, a water-dispersible starch polyether was added to the reaction solution at 0.1 to 2 percent by weight.

Auxiliaries used for conditioning were firstly an aqueous acidic surfactant and secondly an aqueous alkaline polyol, the surfactant and the polyol functioning as wetting aids and being coevaporable via the aqueous phase; both auxiliaries, for conditioning of cured sections, were printed on over the area at about 1 gram per square meter in a thin to ultrathin layer, and the evaporating aqueous phase was removed by suction. According to the illustrative figures, different modes of contact connection make very different advantages and applications accessible. Direct cascading of a single section sequence permits the tapping of photovoltaic potentials that precisely reflect the intensity of the light present; printed photosensors are thus obtainable. Two-dimensional electrodes and optimized section sizes and layer thicknesses, by contrast, maximize the available power and offer the option of employing the printed PV layer combination as a conventional PV power source with a standard efficiency around 10%. A combination of the two measures permits the adjustment of the maximum voltage available in order to specifically provide voltages necessary for particular instruments or applications.

FIGS. 9 to 11 also illustrate the morphologically very different properties of the products of the process: in a departure from established systems and PV layers that are obtainable by coevaporation or other gas phase products, the oversize lumps and coarse particles of the process of the invention seem quite unrefined. However, it is possible by virtue of the specific process measures to incorporate these inexpensive, available raw materials of technical-grade purity in a viable and extremely inexpensive manner into a long-lived and competitive PV layer sequence.

INDUSTRIAL APPLICABILITY

A disadvantage in established PV layer sequences and corresponding production processes is that they are complex in processing terms and require costly pure starting materials in order to be able to reliably provide PV activity.

The problem addressed was therefore that of overcoming the disadvantages and providing a process and a PV layer sequence obtainable by the process, which, in spite of very low production costs, can provide PV function reliably and in a long-lived manner.

The solution is by reactive conditioning of inorganic particles in a room-temperature printing method; the superficial reactive conditioning precisely adjusts the PV activity, gives a kinetically controlled reaction product and can assure the desired PV activity even in the case of starting materials of technical-grade purities around 97%.

LIST OF REFERENCE NUMERALS FOR CLAIMS 100 particles
101 top side
102 reductively treated section
103 oxidatively treated section
200 reaction solution
201 cured reaction solution
300 carrier
301 carrier electrode
302 border (e.g. relief print)
400 top-side contact

LIST OF REFERENCE NUMERALS FOR DESCRIPTION 100 particles
101 top side 102 reductively treated section
103 oxidatively treated section
200 reaction solution
201 cured reaction solution
300 carrier
301 carrier electrode
302 border (e.g. relief print)
400 top-side contact
500 PV measurement assembly
601 back-side electrode
602 back-side electrode in section view
603 TCO layer
604 PV-active Si layer with TCO outer layer and AR outer layer
605 glass carrier and top side
606 5 micrometer scale
701 particles conditioned with reaction solution
702 cured, vitreously amorphous reaction solution
703 20 micrometer scale
801 phase 1 of a matrix composed of two interpenetrating phases
802 phase 2 Of a matrix composed of two interpenetrating phases
803 particles anchored in the matrix
804 5 micrometer scale

The invention claimed is:

1. A process for producing a PV layer sequence, in which at room temperature
inorganic core components
are processed using aqueous solutions or aqueous dispersions by printing methods to obtain a complete PV layer sequence to which contacts can be formed via electrodes, wherein the process comprises the following steps:
a) semiconductive particles of size 0.5 to 100 micrometers, having at least two elements that are dispersed in an aqueous reaction solution, partly dissolved by oxidation or reduction and applied over the area of a carrier,
b) the reaction solution is converted with a contraction in volume to a cured reaction solution layer, where the particles project beyond the cured reaction solution layer and have a bottom side anchored in the reaction solution layer and a top side that projects beyond the reaction solution layer,
c) the top side of the particles is provided at least in sections with a topside contact,
wherein mutually adjoining area sections of the particles are conditioned with different solutions, in turn forming the mutually adjoining area sections of the particles in alternating sequence as sections of reductively treated particles and sections of oxidatively treated particles.

2. The process as claimed in claim 1, wherein the particles are oxidative or reductively conditioned in at least one surface section in at least one additional step, which defines areas of reductively treated particles or areas of oxidatively treated particles.

3. The process as claimed in claim 1, wherein in a further process step, nanoscale structures comprising at least one structure selected from the group consisting of chains, meshes, mesh tubes, is formed in direct contact with particles of at least one area section.

4. The process as claimed in claim 1, wherein in at least one further process step, electrodes comprising at least one carrier electrode or top-side contact layer are applied in a preparatory manner to a two-dimensional material and finally bonded to the PV layer sequence through the two-dimensional material.

5. The process as claimed in claim 1, wherein the carrier used for the PV layer sequence comprises continuous, flat sheets of material, preferably sheets of film or sheets of paper, more preferably sheets of hemp paper.

6. The process as claimed in claim 1, wherein comminuted particles having a grain size of not more than 50 micrometers are used.

7. The process as claimed in claim 1, wherein step a), semiconductive SiC particles of maximum size 30±15 micrometers are dispersed in an aqueous reaction solution of sodium hydroxide-alkalized silica solution with gentle evolution of gas, partly dissolved by oxidation and applied over the area of sections of a film carrier or paper carrier with a carrier electrode applied beforehand,
in step b) the reaction solution is converted with a contraction in volume to a cured reaction solution layer, where the particles project beyond the cured reaction solution layer and have a bottom side anchored in the reaction solution layer and a top side that projects beyond the reaction solution layer,
top-side area sections are oxidatively or reductively conditioned, which defines areas of reductively treated particles or areas of oxidatively treated particles, in turn forming
nanoscale structures comprising at least one structure selected from the group consisting of chains, meshes, mesh tubes, in direct contact with particles in at least one area section, and
mutually adjoining area sections of the particles are conditioned with different solutions, forming the mutually adjoining area sections of the particles in alternating sequence as sections of reductively treated particles and sections of oxidatively treated particles,
in step c) the top side of the particles is provided at least in sections with a topside contact and the alternatingly conditioned area sections of the particles are connected in series and bonded to final contact electrodes.

8. The process as claimed in claim 1, wherein the contact electrodes are printed onto or arranged on an inside of an embedding film and the PV layer sequence obtained by the process is laminated into the embedding film to produce an electrical contact guided out of the embedding material.

9. A PV layer sequence obtained according to claim 1.

10. The process as claimed in claim 1, wherein comminuted particles having a grain size of 30±15 micrometers, are used.

11. The process as claimed in claim 1, wherein comminuted particles having a grain size of 0.5 to 10 micrometers, are used.

12. The process as claimed in claim 1, wherein in a further process step, nanoscale structures comprising at least one structure selected from the group consisting of chains, meshes, mesh tubes, is formed in direct contact with particles of an area section on the top side.

13. The process as claimed in claim 1, wherein step a), semiconductive SiC particles of maximum size 30±15 micrometers are dispersed in an aqueous reaction solution of sodium hydroxide-alkalized silica solution with gentle evolution of gas, partly dissolved by oxidation and applied over the area of sections of a film carrier or paper carrier with a carrier electrode applied beforehand, with an additional printed-on border, in step b) the reaction solution is converted with a contraction in volume to a cured reaction solution layer, where the particles project beyond the cured reaction solution layer and have a bottom side anchored in the reaction solution layer and a top side that projects beyond the reaction solution layer, top-side area sections are oxidatively or reductively conditioned, which defines areas of reductively treated particles or areas of oxidatively treated particles, in turn forming
- nanoscale structures comprising at least one structure selected from the group consisting of chains, meshes, mesh tubes, in direct contact with particles in at least one area section, and
- mutually adjoining area sections of the particles are conditioned with different solutions, forming the mutually adjoining area sections of the particles in alternating sequence as sections of reductively treated particles and sections of oxidatively treated particles, in step c) the top side of the particles is provided at least in sections with a topside contact and the alternatingly conditioned area sections of the particles are connected in series and bonded to final contact electrodes.

14. The process as claimed in claim 1, wherein step a), semiconductive SiC particles of maximum size 30±15 micrometers are dispersed in an aqueous reaction solution of sodium hydroxide-alkalized silica solution with gentle evolution of gas, partly dissolved by oxidation and applied over the area of sections of a film carrier or paper carrier with a carrier electrode applied beforehand, with an additional printed-on border, in step b) the reaction solution is converted with a contraction in volume to a cured reaction solution layer, where the particles project beyond the cured reaction solution layer and have a bottom side anchored in the reaction solution layer and a top side that projects beyond the reaction solution layer, top-side area sections are oxidatively or reductively conditioned, which defines areas of reductively treated particles or areas of oxidatively treated particles, in turn forming
- nanoscale structures comprising at least one structure selected from the group consisting of chains, meshes, mesh tubes, CNT chains and/or halogen chains, in direct contact with particles in at least one area section, and
- mutually adjoining area sections of the particles are conditioned with different solutions, forming the mutually adjoining area sections of the particles in alternating sequence as sections of reductively treated panicles and sections of oxidatively treated particles, in step c) the top side of the particles is provided at least in sections with a topside contact and the alternatingly conditioned area sections of the particles are connected in series and bonded to final contact electrodes.

\* \* \* \* \*